US007457422B2

(12) United States Patent
Greenberg et al.

(10) Patent No.: US 7,457,422 B2
(45) **Date of Patent: *Nov. 25, 2008**

(54) METHOD AND IMPLEMENTATION FOR DETECTING AND CHARACTERIZING AUDIBLE TRANSIENTS IN NOISE

(75) Inventors: Jeffry Allen Greenberg, Ann Arbor, MI (US); Michael Alan Blommer, Ann Arbor, MI (US); Scott Andrew Amman, Milford, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 596 days.

This patent is subject to a terminal disclaimer.

(21) Appl. No.: 09/994,974

(22) Filed: Nov. 29, 2001

(65) Prior Publication Data

US 2002/0097882 A1 Jul. 25, 2002

(51) Int. Cl.

| | |
|---|---|
| ***H04R 29/00*** | (2006.01) |
| ***H04R 3/02*** | (2006.01) |
| ***H04R 25/00*** | (2006.01) |
| ***H03B 29/00*** | (2006.01) |
| ***H03G 7/00*** | (2006.01) |

(52) U.S. Cl. ............................ 381/56; 381/58; 381/98; 381/317; 381/320; 381/71.11; 381/71.14; 381/106; 381/73.1

(58) Field of Classification Search .................. 381/56, 381/58, 92, 73.1, 122, 111, 312–320, 98, 381/106, 71, 11, 14; 123/406.11; 73/35.01; 340/438–440; 701/99
See application file for complete search history.

(56) References Cited

U.S. PATENT DOCUMENTS

| | | | | | |
|---|---|---|---|---|---|
| 3,885,720 | A | | 5/1975 | Brennan | |
| 4,012,942 | A | | 3/1977 | Harned | |
| 4,061,116 | A | * | 12/1977 | Saida et al. | 123/406.35 |
| 4,429,565 | A | * | 2/1984 | Utsumi et al. | 73/35.03 |
| 4,481,924 | A | | 11/1984 | Kobayashi | |
| 4,617,895 | A | | 10/1986 | Sakakibara et al. | |
| 5,027,774 | A | | 7/1991 | Dutkiewicz et al. | |
| 5,284,047 | A | | 2/1994 | Brokaw | |
| 5,535,722 | A | | 7/1996 | Graessley et al. | |
| 5,608,633 | A | * | 3/1997 | Okada et al. | 701/111 |
| 5,892,375 | A | | 4/1999 | Vulih et al. | |
| 6,012,426 | A | * | 1/2000 | Blommer | 123/406.38 |

* cited by examiner

*Primary Examiner*—Vivian Chin
*Assistant Examiner*—Devona E. Faulk
(74) *Attorney, Agent, or Firm*—Dickinson Wright PLLC; Greg Brown

(57) ABSTRACT

A method and implementation for detecting and characterizing audible transients in noise includes placing a microphone in a desired location, producing a microphone signal wherein the microphone signal is indicative of the acoustic environment, processing the microphone signal to estimate the acoustic activity that takes place in the human auditory system in response to the acoustic environment, producing an excitation signal indicative of the estimated acoustic activity, processing the excitation signal to identify each impulsive sound frequency-dependent activity as a function of time, producing a detection signal indicative of audible impulse sounds, processing the detection signal to identify an audible impulsive sound, and characterizing each impulsive sound.

3 Claims, 2 Drawing Sheets

METHOD AND IMPLEMENTATION FOR DETECTING AND CHARACTERIZING AUDIBLE TRANSIENTS IN NOISE

FIELD OF THE INVENTION

The present invention relates to identifying impulsive sounds in a vehicle, and more specifically, to a method and implementation for detecting and characterizing audible transients in noise.

BACKGROUND OF THE INVENTION

Impulsive sounds are defined as short duration, high energy sounds usually caused by an impact. Examples of impulsive sounds include gear rattle, body squeaks and rattles, strut chuckle, ABS, driveline backlash, ticking from valve-train and fuel injectors, impact harshness, and engine rattles. Methods that can determine and predict the audible threshold of these impulse sounds, as well as identify their above-threshold characteristics, are important tools. The ability to predict thresholds is useful for cascading vehicle-level thresholds down to component-level thresholds, and ultimately, in developing appropriate bench tests for system components. Identifying the above-threshold characteristics is useful as a diagnostic tool for identifying impulsive sounds in a vehicle, and also for developing relevant sound quality methods.

Three properties of a detection and classification algorithm are desired. The first is to detect different classes of impulsive sounds without having to subjectively tune algorithm parameters for each class. The second is to identify the temporal and spectral characteristics of the impulsive sounds. The final desired property is to correlate predicted thresholds with subjective detection thresholds. Existing algorithms do not satisfy all three properties. Current algorithms that identify temporal and spectral characteristics typically require subjective tuning of parameters for each class in order to correlate with subjective thresholds. Further, algorithms that automatically identify impulses in a sound do not characterize both the temporal and spectral content of the impulses.

Correlation to subjective thresholds is largely due to processing the sound with a model of the auditory system. This provides the temporal and spectral data relevant to hearing. Most algorithms use wavelets or other time-frequency techniques, and as a result, it is difficult to generalize hearing properties to these models. Of the current algorithms that are based on auditory models, they require subjective interpretation of the temporal and spectral information to identify the impulsive sounds.

It is therefore desired to have a method and implementation for detecting and characterizing audible transients in noise, specifically having automated interpretation of temporal and spectral information, and the ability to identify impulsive sounds over a large range of background sound levels.

SUMMARY OF THE INVENTION

It is an object of the present invention to provide a method and implementation for detecting and characterizing audible transients in noise that overcomes the disadvantages of the prior art.

Accordingly, the present invention advantageously provides a method and implementation for detecting and characterizing audible transients in noise including placing a microphone in a desired location, producing a microphone signal wherein the microphone signal is indicative of the acoustic environment, processing the microphone signal to estimate the acoustic activity that takes place in the human auditory system in response to the acoustic environment, producing an excitation signal indicative of the estimated acoustic activity, processing the excitation signal to identify each impulsive sound frequency-dependent activity as a function of time, producing a detection signal indicative of audible impulse sounds, processing the detection signal to identify an audible impulsive sound, and characterizing each impulsive sound.

It is a feature of the present invention that the method and implementation for detecting and characterizing audible transients in noise has automated interpretation of temporal and spectral information, and has the ability to identify impulsive sounds over a large range of background sound levels.

BRIEF DESCRIPTION OF THE DRAWINGS

These and other objects, features, and advantages of the present invention will become apparent from a reading of the following detailed description with reference to the accompanying drawings, in which.

DESCRIPTION OF THE PREFERRED EMBODIMENTS

Figure 1:
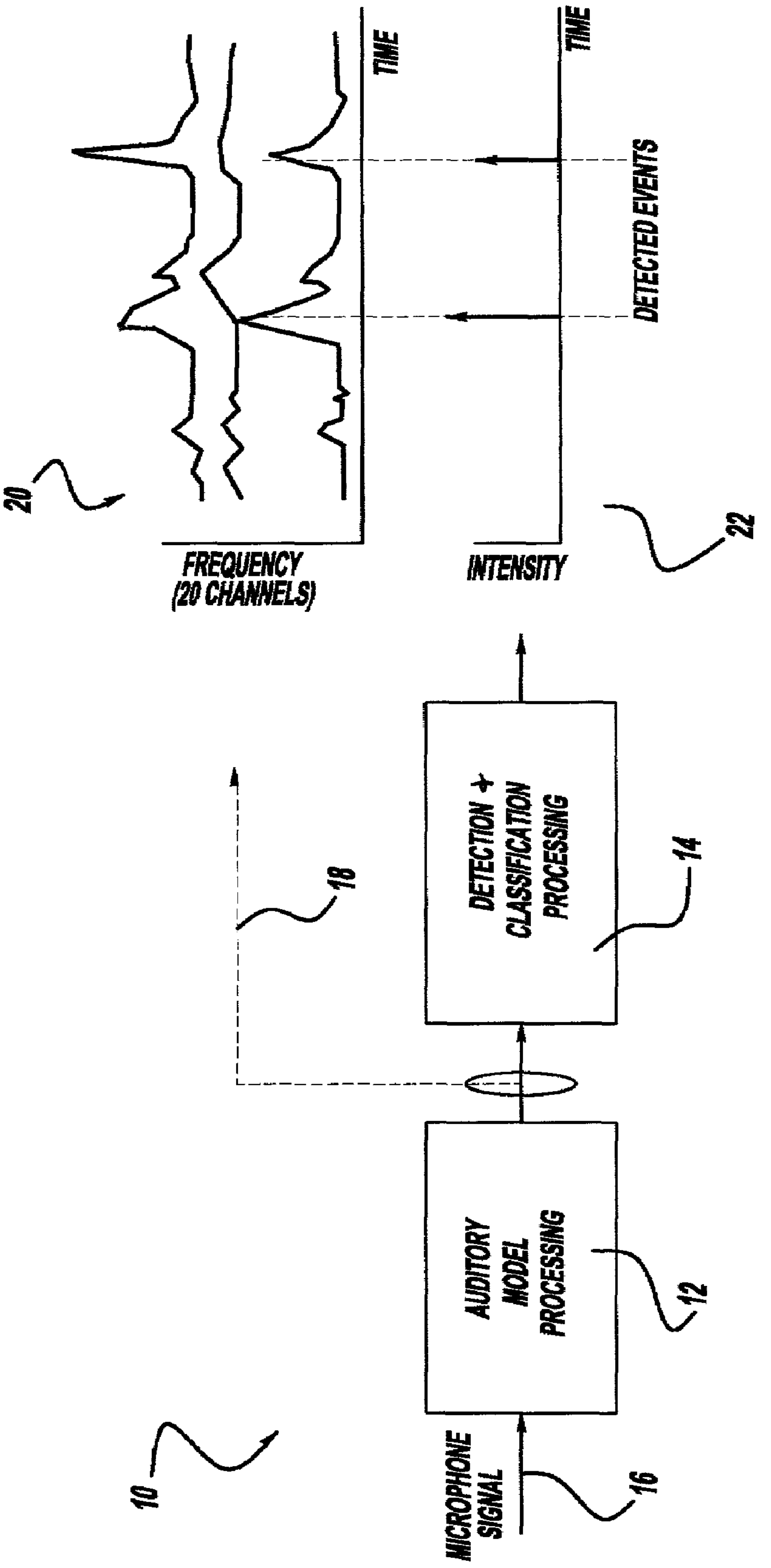
FIG. 1 is a flow diagram showing the processing and detecting of impulsive sounds of the present invention.

Referring to FIG. 1, a flow diagram 10 showing the processing and detecting of impulsive sounds of the present invention is shown. Flow diagram 10 includes two stages: an auditory model processing stage 12, and a detection and classification processing stage 14.

Initially, auditory model processing stage 12 receives a microphone signal 16 that is processed using a model of the human auditory system. Stage 12 then outputs twenty channels of data 18, where each channel represents frequency-dependent activity in the auditory system as a function of time. This output data 18 is processed to detect and characterize impulsive sounds. Examples of data from three channels 20 are shown, where traces have been offset vertically for viewing purposes.

Detection and classification processing stage 14 receives the data 18 from the auditory model processing stage 12. If an impulsive sound is detected, it is characterized by its time-of-occurrence and intensity. An example of detecting and characterizing two impulsive sounds 22 is shown.

Figure 2:
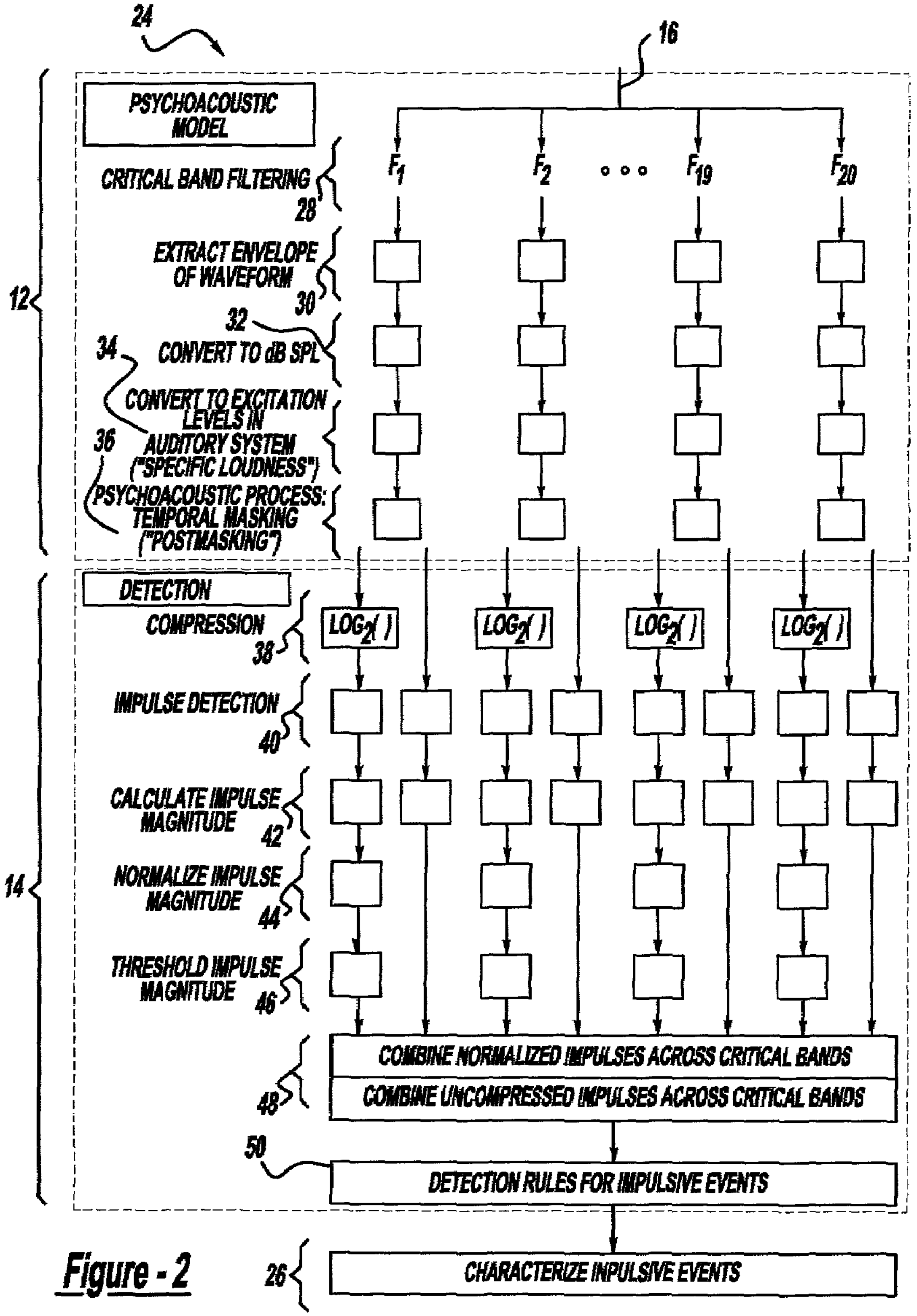
FIG. 2 is a detailed flow diagram showing the psychoacoustic, detection, and characterization processes of the present invention.

Referring now to FIG. 2, a highly detailed flow diagram 24 showing the auditory model processing or psychoacoustic model stage 12, detection and classification processing stage 14, and characterization process stage 26 of the present invention is shown. Psychoacoustic model stage 12 consists of the following phases: critical band filtering 28, extraction envelope of waveform 30, conversion to dB SPL 32, conversion to excitation levels in auditory system 34, and the psychoacoustic process of temporal masking 36. The detection and classification processing stage 14 consists of the following phases: compression 38, impulse detection 40, calculation of impulse magnitude 42, normalization of impulse magnitude 44, threshold impulse magnitude 46, combining impulses across critical bands 48, and detection rules for impulsive events 50.

The psychoacoustic model stage 12 attempts to represent excitation levels, or acoustic activity, in the human auditory system. The first phase of processing sound in the auditory system is implemented by passing the sound through a bank of bandpass filters, known as critical band filtering 28. The remaining phases model non-linear processing in the auditory system, resulting in a time-frequency representation of the acoustic activity in the auditory system.

In operation, critical band filtering 28 divides the microphone signal 16 into twenty equal signals. The microphone signal 16 is an electrical signal representing the acoustic environment, possibly containing transient or impulsive sounds. Critical band filtering 28 filters the divided signal to extract signals with different frequency content. Each critical band filter corresponds to a respective divided signal. Each filter is preferably derived from ⅓ octave filters. Each filter receives its respective divided signal to pass a signal of desired frequency content.

Phase 30 then extracts the envelope of the waveform of the divided filtered signal. Then phase 32 converts the extracted envelope to decibel, or dB SPL. Phase 34 then converts the extracted envelope to an excitation level corresponding to an excitation level used in the auditory system, also called specific loudness. Phase 36 then temporal masks the extracted envelope, also called postmasking. Postmasking refers to the masking of a sound by a previously-occurring sound. Postmasking effects are caused by the decay of specific loudness levels in the masker.

Phase 38 of the detection and classification processing stage 14 then compresses the output of temporal masking phase 36 of the psychoacoustic model stage 12. Compression 38 is done through $\log_2(\ )$. The output of temporal masking phase 36 is in units of sone/bark, which generally follows a doubling law. That is, if sound A generates x sone/bark in a particular critical band, then doubling the loudness of A will generate approximately 2×sone/bark in that critical band. Compression 38 through $\log_2()$ allows for computing relative changes in the excitation level, independent of the absolute value.

Phase 40 then detects the impulse of the compressed output signal from the compression phase 38. In the impulse detection phase 40, standard peak-picking algorithms are used. The peaks are selected such that they are the largest peaks within a neighborhood ranging from approximately 10-50 msec depending on the critical band center frequency.

Phase 42 then calculates the magnitude of the impulse detected by phase 40. Both compressed and uncompressed magnitudes of each impulse are calculated by taking the difference between its peak value and a local minimum preceding the peak.

Phase 44 then normalizes the impulse magnitude calculated by phase 42. The compressed impulsive magnitudes are normalized by their root-mean square (RMS) value within the critical band.

Phase 46 then thresholds the normalized magnitudes from phase 44. The only impulses that are kept are the impulses that have normalized magnitudes greater than a. Empirically, a=2 results in satisfactory agreement of the algorithm with detection of transient sounds by listeners.

Phase 48 then combines the impulses across the critical bands from the twenty divided signals. To combine the divided signals, phase 48 searches for time-alignment of impulses across the critical bands. In particular, at time t, phase 48 identifies the normalized impulses across all critical bands that are within a temporal window of 5 msec duration and centered at t. Phase 48 then computes the sum-of-squares of the identified normalized impulses for time sample t. The square root of the result is set equal to $K_n(t)$. Similarly, for the corresponding uncompressed impulse magnitudes, phase 48 computes $K_u(t)$. Each one of the events where $K_n(t)>0$ is labeled a potential impulsive event.

Phase 50 then processes the potential impulsive events in accordance with the detection rule for identifying an audible impulsive event. In particular, if $K_n(t)\geqq 3.0$ and $K_u(t)\geqq 0.2$ then the potential impulsive event is labeled as an impulsive event.

In the characterization process stage 26, each impulsive event from phase 50 of the detection and classification processing stage 14 is characterized by its time-of-occurrence, t, and by its intensity, $K_n(t)$.

While only one embodiment of the method and implementation for detecting and characterizing audible transients in noise of the present invention has been described, others may be possible without departing from the scope of the following claims.

What is claimed is:

1. A method and implementation for detecting and characterizing audible transients in noise, comprising:

placing a microphone in a predetermined location;

producing a microphone signal wherein the microphone signal is indicative of the acoustic environment;

processing the microphone signal to estimate the acoustic activity that takes place in the human auditory system in response to the acoustic environment, said step of processing the microphone signal includes dividing the microphone signal into a plurality of signals, bandpass filtering each of the divided signals to pass signals having desired center frequencies, and processing the bandpass signals to produce the excitation signal indicative of the estimated acoustic activity by extracting an envelope signal indicative of the waveform envelope for each of the bandpass signals, converting the envelope signal for each of the bandpass signals to an excitation level used in the human auditory system; and temporal masking the converted envelope signal for each of the bandpass signals;

producing an excitation signal indicative of the estimated acoustic activity;

processing the excitation signal to identify each impulsive sound frequency-dependent activity as a function of time by compressing the temporal masked converted envelope signal for each of the bandpass signals, detecting impulses of the temporal mask converted envelope signal for each of the bandpass signals, calculating the magnitudes of the detected impulses for each of the bandpass signals, normalizing the calculated impulse magnitudes for each of the bandpass signals, and thresholding the normalized impulse magnitudes for each of the bandpass signals;

producing a detection signal indicative of audible impulse sounds;

processing the detection signal to identify an audible impulsive sound; and characterizing each impulsive sound.

2. The method of claim 1, wherein producing a detection signal comprises:

combining both the normalized impulse magnitudes and the uncompressed impulse magnitudes of the bandpass signals; and comparing both the combined normalized impulse magnitude to a given threshold and the combined uncompressed impulse magnitude to a given threshold.

3. The method of claim 1, wherein an audible impulsive sound occurs when the magnitude of the combined normalized impulse is greater than the given magnitude threshold and when the magnitude of the uncompressed impulse is greater than the given magnitude threshold.

* * * * *